United States Patent
Moon et al.

(10) Patent No.: US 8,310,648 B2
(45) Date of Patent: Nov. 13, 2012

(54) METHOD OF FABRICATING LIQUID CRYSTAL DISPLAY DEVICE HAVING A LIGHT-SENSING THIN FILM TRANSISTOR DISPOSED AT A PIXEL REGION

(75) Inventors: Su Hwan Moon, Gumi-si (KR); Tae Hwan Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/344,369

(22) Filed: Jan. 5, 2012

(65) Prior Publication Data

US 2012/0164769 A1 Jun. 28, 2012

Related U.S. Application Data

(62) Division of application No. 11/967,680, filed on Dec. 31, 2007, now Pat. No. 8,111,344.

(30) Foreign Application Priority Data

Mar. 30, 2007 (KR) .......................... 10-2007-0031485

(51) Int. Cl.
*G02F 1/13* (2006.01)
*G02F 1/1335* (2006.01)
*G02F 1/136* (2006.01)

(52) U.S. Cl. .............................. 349/187; 349/12; 349/48
(58) Field of Classification Search .................... 349/12, 349/48, 116, 187; 345/175
See application file for complete search history.

(56) References Cited

U.S. PATENT DOCUMENTS

| 2003/0156230 A1 | 8/2003 | Boer et al. |
| 2004/0189621 A1 | 9/2004 | Cho et al. |
| 2006/0279677 A1 | 12/2006 | Matsushima |
| 2006/0279690 A1 | 12/2006 | Yu et al. |

*Primary Examiner* — Mark Robinson
*Assistant Examiner* — Michael Inadomi
(74) *Attorney, Agent, or Firm* — Brinks Hofer Gilson & Lione

(57) ABSTRACT

The disclosure describes a liquid crystal display device with a sensing function and a method of fabricating the same. The device comprising gate and data lines crossing each other on a substrate, so as to define a pixel region including a pixel electrode; a first switching thin film transistor disposed at a crossing of the gate and data lines; a sensing thin film transistor, disposed at a predetermined portion of the pixel region, that senses external light; a sensing storage capacitor that stores a signal sensed by the sensing thin film transistor; and a second switching thin film transistor that receives the sensing signal stored and reads information that is externally inputted, wherein the sensing storage capacitor and the second switching thin film transistor are provided with a reflective region including a reflective electrode.

8 Claims, 6 Drawing Sheets

METHOD OF FABRICATING LIQUID CRYSTAL DISPLAY DEVICE HAVING A LIGHT-SENSING THIN FILM TRANSISTOR DISPOSED AT A PIXEL REGION

The present patent document is a divisional of U.S. patent application Ser. No. 11/967,680, filed Dec. 31, 2007, now U.S. Pat. No. 8,111,344, which claims priority to Korean Patent Application No. 2007-0031485 filed in Korea on Mar. 30, 2007, which is hereby incorporated by reference.

BACKGROUND

1. Field of the Invention

The present invention relates to a liquid crystal display device and a method of fabricating the same, and more particularly, to a liquid crystal display device with a sensing function and a method of fabricating the same.

2. Discussion of the Related Art

A liquid crystal display device includes a color filter substrate provided with a color filter and a black matrix; a thin film transistor array substrate provided with a thin film transistor used as a switching unit and a pixel electrode; and a liquid crystal layer formed by injecting a liquid crystal material having an anisotropic dielectric constant into a space between the color filter substrate and the thin film transistor array substrate. A different electric potential is applied to the electrodes on the substrates. The intensity of a resulting electric field formed in the liquid crystal material can be controlled to thereby change alignment of liquid crystal molecules in the liquid crystal layer. Through the change in alignment of the liquid crystal molecules, it is possible to control an amount of light passing through a transparent insulation substrate, thereby displaying desired images.

The liquid crystal display device does not itself emit light. Therefore, it is necessary to provide the liquid crystal display device with a backlight unit. The backlight unit is provided at the rear surface of liquid crystal panel to display images, so that an entire screen is illuminated uniformly with the light emitted from the backlight unit. Based on a structure of the thin film transistor array substrate, the liquid crystal display device can be classified into a display function and a sensing function (touch sensor, fingerprint sensor, etc.).

In the case where the liquid crystal display device has a sensing function, each pixel region is provided with a sensor driving circuit. The sensor driving circuit formed in each pixel region is provided with a light-shielding region, which prevents the incidence of light generated from the backlight unit.

Due to the sensor driving circuit with the light-shielding region in each pixel region, a light-transmission region, which permits the incidence of light generated from the backlight unit, is decreased in size.

Thus, the entire luminance of the liquid crystal panel is decreased.

Also, a liquid crystal display device with the sensing function includes the sensor driving circuit as well as the switching unit, so that a power consumption of the liquid crystal display panel is increased.

BRIEF SUMMARY

A liquid crystal display device with a sensing function comprises gate and data lines crossing each other on a substrate, so as to define a pixel region including a pixel electrode. A first switching thin film transistor is formed at a crossing of the gate and data lines. A sensing thin film transistor is formed at a predetermined portion of the pixel region for sensing external light. A sensing storage capacitor stores a signal sensed by the sensing thin film transistor. A second switching thin film transistor receives the sensing signal stored and reads information that is externally input. The sensing storage capacitor and the second switching thin film transistor are provided with a reflective region including a reflective electrode.

In another aspect, a method of fabricating a liquid crystal display device with sensing function comprises forming gate patterns including a gate line, a gate electrode of a first switching thin film transistor, a gate electrode of a second switching thin film transistor, and a gate electrode of a sensing thin film transistor on a substrate; forming a gate insulation film on the substrate including the gate patterns; forming a semiconductor layer on the first switching thin film transistor, the second switching thin film transistor and the sensing thin film transistor formed on the substrate including the gate insulation film; forming source/drain electrode patterns including a data line crossing the gate line with the gate insulation film interposed therebetween, source and drain electrodes of the first switching thin film transistor, source and drain electrodes of the second switching thin film transistor, and driving source and drain electrodes of the sensing thin film transistor; forming a first passivation film and a reflective electrode on the regions of the storage capacitor and the second switching thin film transistor; forming a second passivation film including a hole to expose the drain electrode of the first switching thin film transistor on the substrate including the reflective electrode; and forming a pixel electrode connected to the drain electrode of the first switching thin film transistor through the hole.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a liquid crystal display device according to the present invention will be explained with reference to the accompanying drawings.

Figure 1:
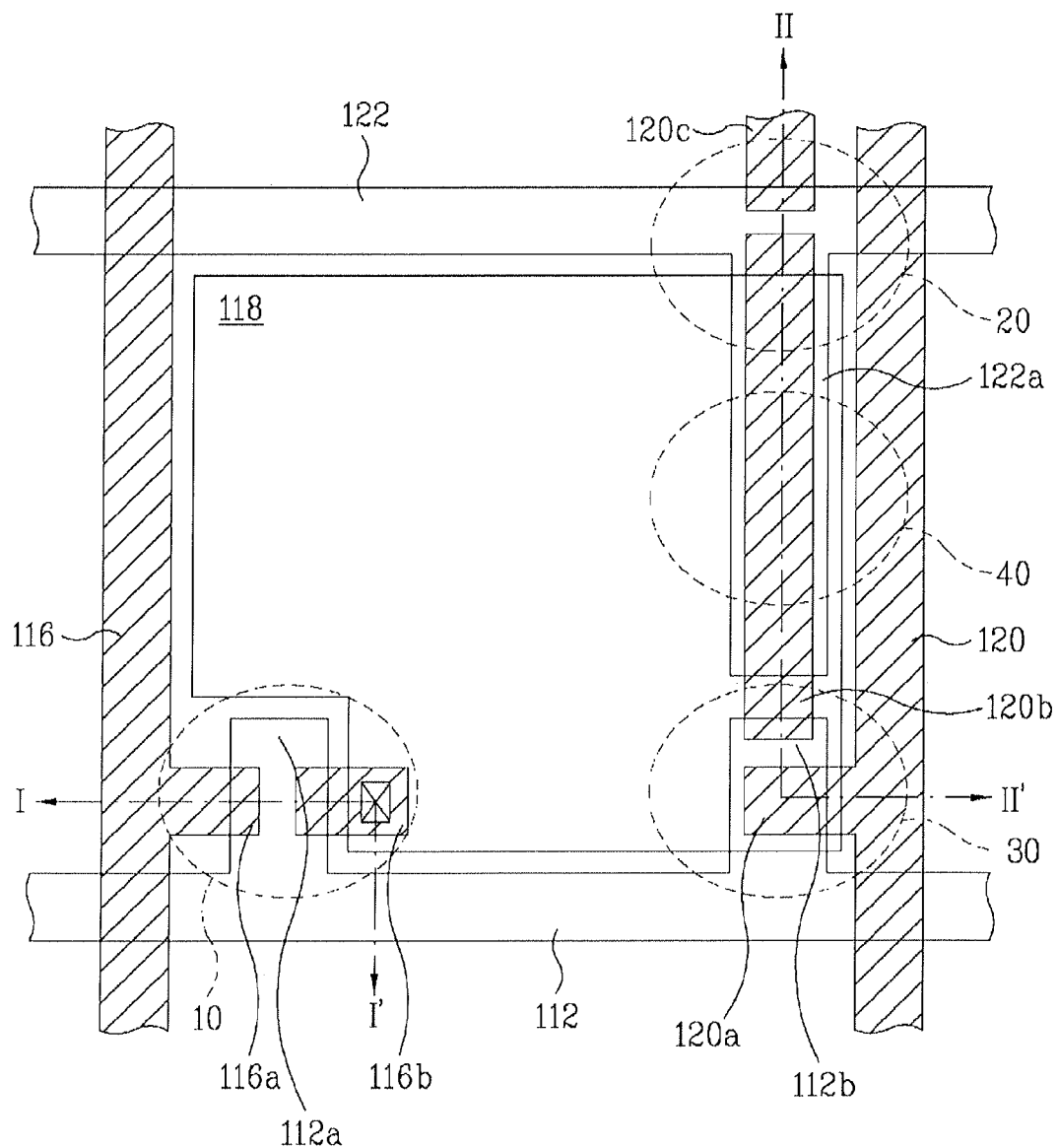
FIG. 1 is a plan diagram illustrating a liquid crystal display device with a sensing function according to the present disclosure.
Figure 2:
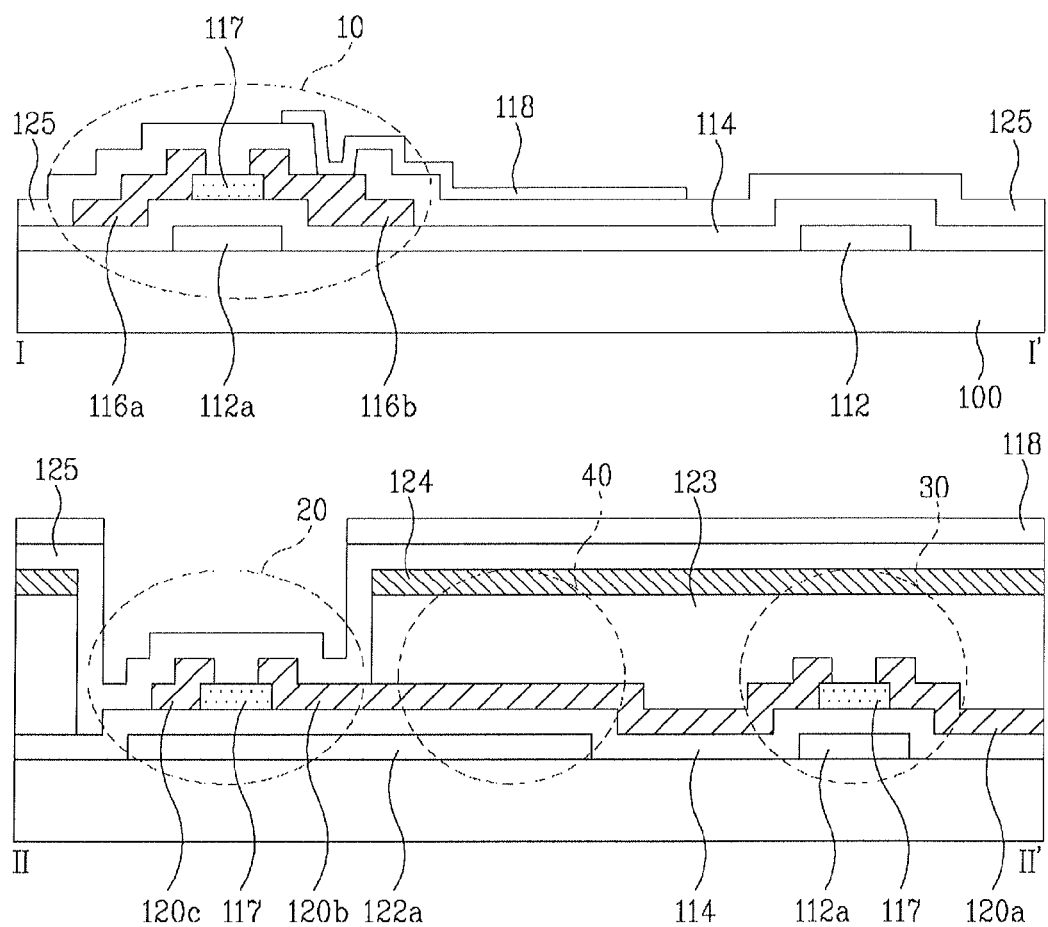
FIG. 2 is a cross sectional diagram along I-I' and II-II' of FIG. 1.

FIG. 1 is a plan diagram illustrating a liquid crystal display device with a sensing function according to the present disclosure. FIG. 2 is a cross sectional diagram along I-I' and II-II' of FIG. 1. FIGS. 1 and 2 illustrate a thin film transistor array substrate of a liquid crystal display device with a sensing function according to the present disclosure. The thin film transistor array substrate is positioned in opposite to a color filter array substrate in state of interposing a liquid crystal layer therebetween, wherein the color filter array substrate includes a black matrix and a color filter.

As shown in FIGS. 1 and 2, the thin film transistor array substrate with the sensing function according to the present invention includes gate and data lines 112 and 116 crossing each other on a lower substrate 100 so as to define a pixel region in state of interposing a gate insulation film 114 therebetween. A first switching thin film transistor 10 of pixel is formed at each crossing of the gate and data lines 112 and 116. A pixel electrode 118 is formed in a predetermined portion of the pixel region. A read-out line 120 is formed in parallel to the data line 116 in state of interposing the pixel electrode 118 within the pixel region. First and second driving voltage supplying lines (not shown, 122) are formed in parallel to the gate line, to supply a driving voltage to a sensing thin film transistor 20. A sensing thin film transistor 20 is formed at a crossing of the second driving voltage supplying line 122 and the read-out line 120. A second switching thin film transistor 30 is formed at a crossing of the gate line 112 and the read-out line 120. In addition, a sensing storage capacitor 40 is disposed between the sensing thin film transistor 20 and the second switching thin film transistor 30, and a pixel storage capacitor (not shown) is disposed at an overlap between the pixel electrode 118 and the previous gate line.

The first switching thin film transistor 10 includes a gate electrode 112a diverged from the gate line 112; a source electrode 116a diverged from the data line 116; a drain electrode 116b connected to the pixel electrode 118 via a contact hole; a semiconductor layer 117 overlapped with the gate electrode 112a and forming a channel between the source and drain electrodes 116a and 116b; and an ohmic contact layer (not shown) formed on the semiconductor layer 117. The semiconductor layer 117 overlaps with the source electrode 116a and the drain electrodes 116b, and includes a channel region between the source and drain electrodes 116a and 116b. Accordingly, the first switching thin film transistor 10 charges and maintains the pixel electrode 118 with a pixel voltage signal supplied to the data line 116 in response to a gate signal supplied to the gate line 112.

The pixel electrode 118 is connected to the drain electrode 116b of the first switching thin film transistor 10 via a contact hole passing through a passivation film 123. Thus, there is a potential difference between the pixel electrode 118 charged with the pixel voltage and the common electrode on the color filter array substrate (not shown) or on the lower substrate having the pixel electrode. By this potential difference, the liquid crystal molecules provided between the thin film transistor array substrate and the color filter array substrate are rotated to transmit the incident light through the pixel electrode 118 from the lower surface of the lower substrate toward the color filter array substrate.

The pixel storage capacitor (not shown) is formed by the previous gate line 116 and the pixel electrode 118, and the gate insulation film 114 and the passivation film 123 are positioned between the gate line 116 and the pixel electrode 118. Accordingly, the pixel storage capacitor (not show) makes the pixel electrode maintained with the pixel voltage charged therein until the next pixel voltage is charged therein.

The liquid crystal display device with the sensing function includes a sensing driving circuit as well as the first switching thin film transistor and the pixel storage capacitor. The sensing driving circuit includes the sensing thin film transistor 20, the second storage capacitor 30 and the second switching thin film transistor 40.

The sensing thin film transistor 20 includes a gate electrode 122a connected to the second driving voltage supplying line 122 supplied with a second driving voltage; a semiconductor layer and ohmic contact layer 117 overlapped with the gate electrode 122a in state of interposing the gate insulation film 114 therebetween; a driving source electrode 120c electrically connected with the semiconductor layer and ohmic contact layer 122a and connected to the first driving voltage supplying line (not shown) supplied with a first driving voltage; and a driving drain electrode 120b positioned in opposite to the driving source electrode 120c. The sensing thin film transistor 20 includes a second contact hole (not shown) passing through the gate insulation film 114 so as to expose the predetermined portion of the first driving voltage supplying line (not shown). Also, the driving source electrode 120c is connected to the first driving voltage supplying line (not shown) via a metal pattern (not shown) formed on the second contact hole (not shown). The semiconductor layer and ohmic contact layer 117 overlap with the driving source electrode 120c and the driving drain electrode 120b, and also include the channel region between the driving source electrode 120c and the driving drain electrode 120b. Thus, the sensing thin film transistor 20 senses the incident light by touch or images, for example, fingerprints.

The first storage capacitor 40 includes a storage capacitor lower electrode 122a which is formed as one body with the gate electrode 122a of the sensing thin film transistor 20; and a storage capacitor upper electrode 120b which is overlapped with the storage capacitor lower electrode 122a in state of interposing the gate insulation film 114 therebetween, and is formed as one body with the driving drain electrode 120b of the sensing thin film transistor 20. Accordingly, the first storage capacitor 40 stores charges by a photoelectric current generated from the sensing thin film transistor 20.

The second switching thin film transistor 30 includes a gate electrode 122b formed on the substrate; a source electrode 120b connected to the storage capacitor upper electrode; a drain electrode 120a positioned in opposite to the source electrode 120b and connected to the read-out line 120; a semiconductor layer, overlapped with the gate electrode 112a, for forming the channel region between the source and drain electrodes; and an ohmic contact layer (not shown) formed on the semiconductor layer.

The operation of the disclosed sensing driving circuit will be briefly explained. As the driving voltage is applied to the driving source electrode 120c of the sensing thin film transistor 20, the voltage is applied to the gate electrode 122a, and light is sensed in the active layer, a photoelectric current path from the driving source electrode 120c to the driving drain electrode 112b through the channel is generated based on the amount of light sensed.

The photoelectric current path flows toward the storage capacitor upper electrode 120b, and simultaneously the storage capacitor lower electrode 122a is brought into contact with the gate electrode 122a of the sensing thin film transistor 20, whereby the storage capacitor is charged with the charges by the photocurrent. The charges charged in the storage capacitor are read in a read-out integrated circuit (not shown) via the second switching thin film transistor and the read-out line 120. That is, the signal detected in the read-out integrated circuit is varied based on the amount of light sensed by the sensing thin film transistor. It is possible to sense images of a document, image scan or touch input. The sensed images may be transmitted to a controller, or the images may be realized on the liquid crystal display panel according to the control of a user.

Figure 3A:
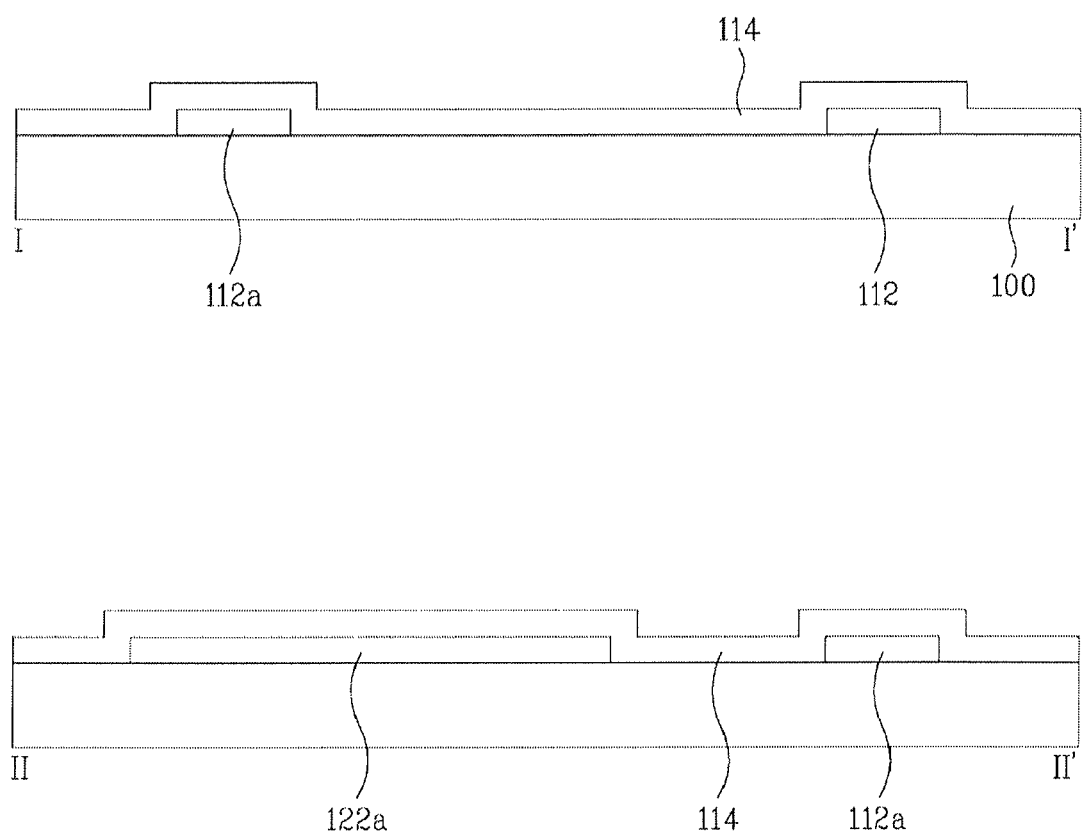
FIGS. 3A to 3D are cross sectional diagrams illustrating a method of fabricating a liquid crystal display device with a sensing function according to the present disclosure.
Figure 3B:
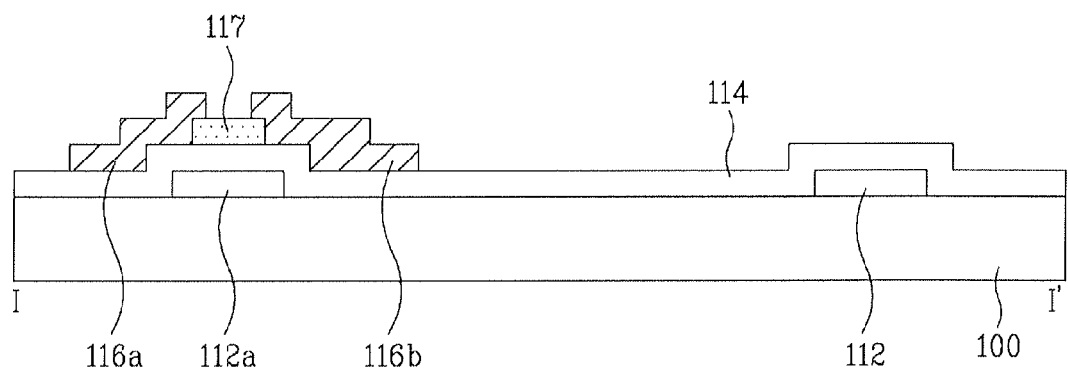
Figure 3B:
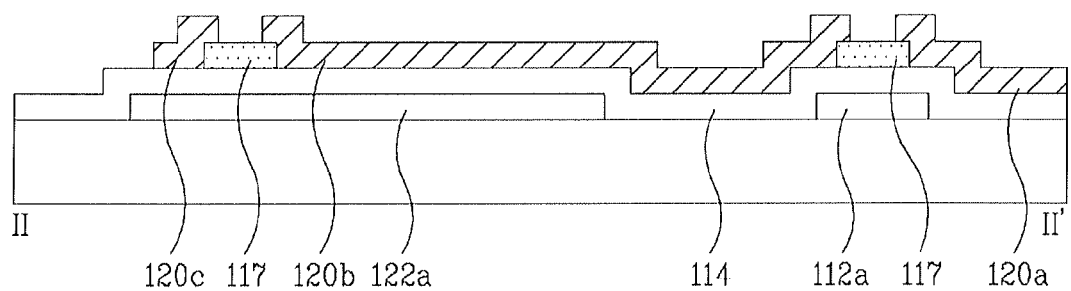
Figure 3C:
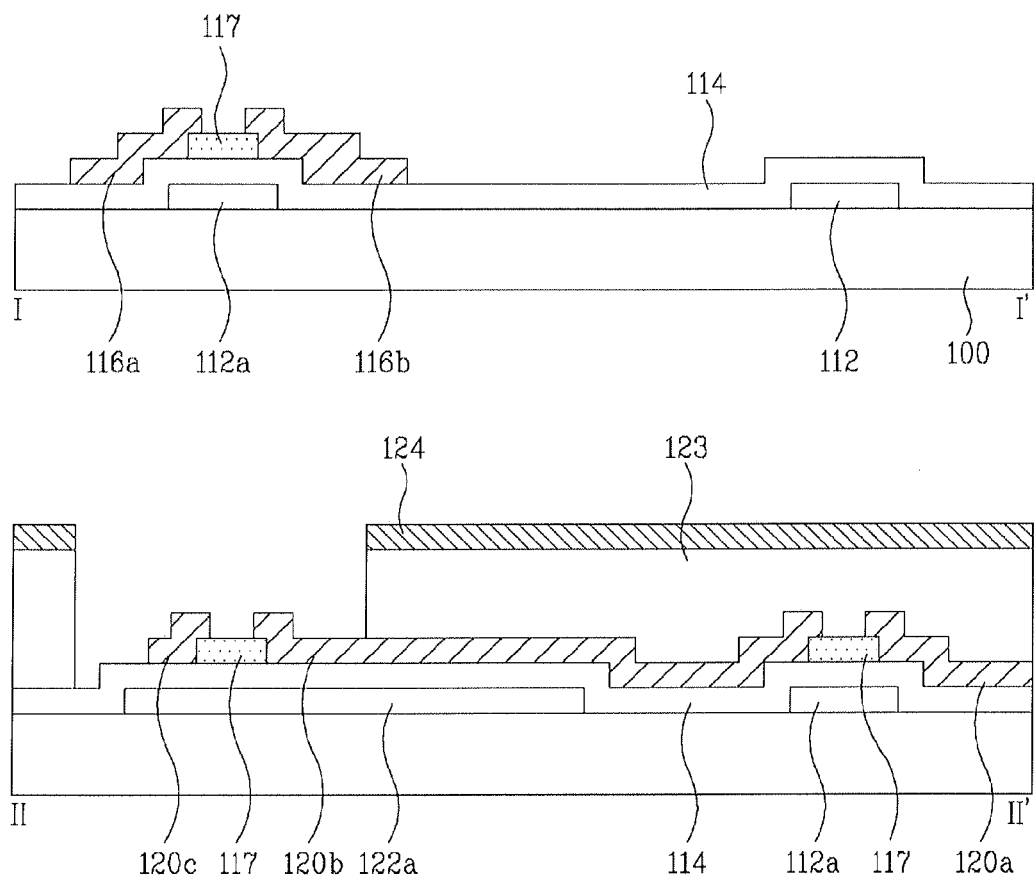
Figure 3D:
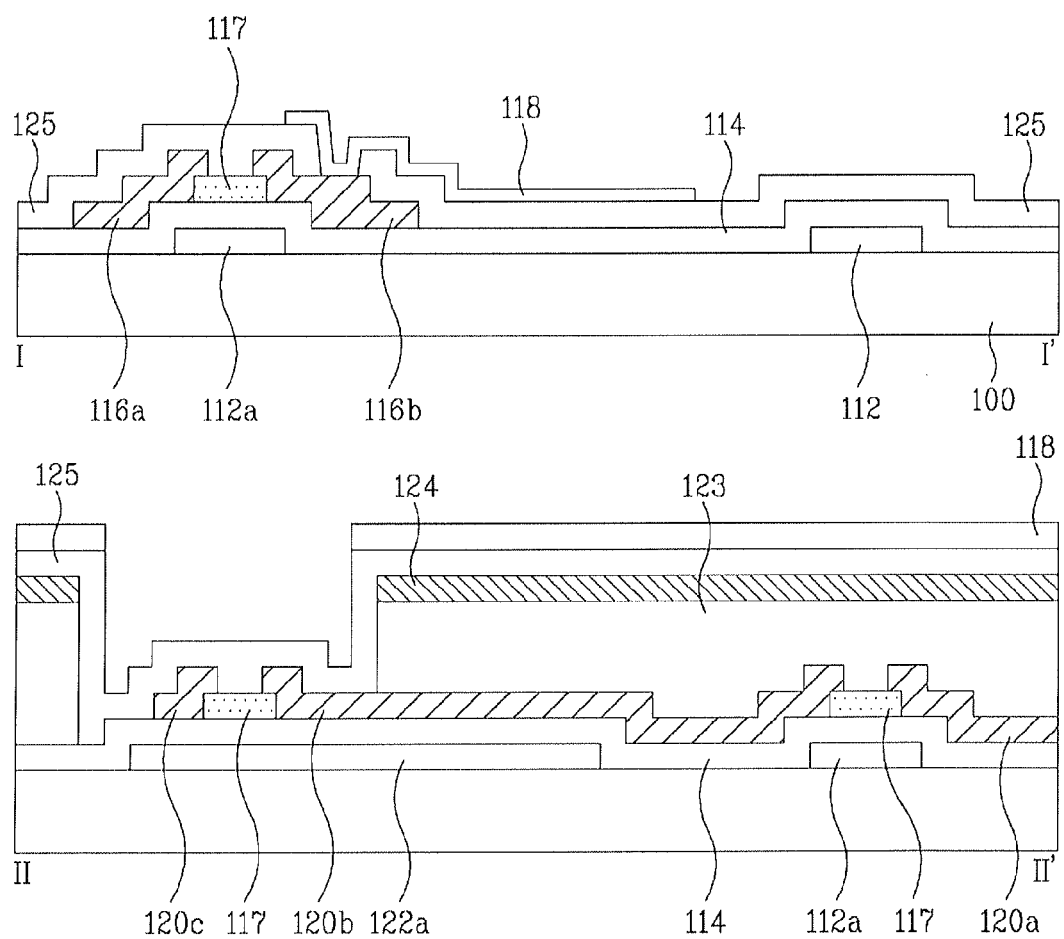

The region provided with the second storage capacitor 30 and the second switching thin film transistor 40 of the sensing driving circuit is provided with a reflective region having a reflective electrode (124 in FIG. 3D). In comparison to the related art liquid crystal display panel having the sensing driving circuit formed only with the light-shielding region, the liquid crystal display panel of the present disclosure, which includes the sensing driving circuit provided with the reflective region and light-shielding region, has a relatively higher luminescence. Also, the liquid crystal display panel according to the present disclosure includes the sensing driving circuit provided with the reflective region, so that it is possible to lower the power consumption due to the use of an external light or artificial light source.

FIGS. 3A to 3D are cross sectional diagrams illustrating a method of fabricating a liquid crystal display device with a sensing function according to the present disclosure.

After forming a gate metal layer on the substrate 100, the gate metal layer is patterned by photolithography, thereby forming gate patterns including the gate line 112, the gate electrode 112a of the first switching thin film transistor 10, the gate electrode 112b of the second switching thin film transistor 30, the first driving voltage supplying line (not shown), the second driving voltage supplying line 122, and the gate electrode 122a of the sensing thin film transistor 20, as shown in FIG. 3A. At this time, the second driving voltage supplying line 122 is formed as one body with the storage capacitor lower electrode 122a. Then, the gate insulation film 114 is formed on the substrate 100 including the gate patterns.

Thereafter, a n+-type amorphous silicon layer is formed on the substrate 100 including the gate insulation film 114, and is then patterned by photolithography, thereby forming the first switching thin film transistor 10, the second switching thin film transistor 30, and the semiconductor layer 117 of the sensing thin film transistor 20, as shown in FIG. 3B. In this case, the semiconductor layer 117 is formed in a double-layered structure comprised of the active layer and the ohmic contact layer.

After forming a source/drain metal layer on the substrate 100 including the semiconductor layer 117, the source/drain metal layer is patterned by photolithography, thereby forming source/drain patterns including the data line 116, the source and drain electrodes 116a and 116b of the first switching thin film transistor 10, the source and drain electrodes 120a and 102b of the second switching thin film transistor 30, the driving source and drain electrodes 120c and 120b of the sensing thin film transistor 20, the storage capacitor upper electrode 120b of the first storage capacitor 40 connected to the driving drain electrode 120b, and the read-out line 120.

After a first passivation film is formed on the substrate 100 including the source/drain patterns, the first passivation film is patterned by photolithography, thereby forming the first passivation film 123 on the first storage capacitor 40 and the second switching thin film transistor 30, as shown in FIG. 3C. Then, a reflective electrode metal layer is formed on the substrate 100 including the first passivation film 123, and then the reflective electrode metal layer is patterned by photolithography, thereby forming the reflective electrode 124 on the first passivation film 123. At this time, the reflective electrode metal layer is formed of a metal material having low resistance and high reflectivity, for example, aluminum Al.

As shown in FIG. 3D, after forming a second passivation film 125 on the substrate 100 including the reflective electrode 124, the second passivation film is patterned by photolithography, thereby forming the contact hole (not shown) for exposing the drain electrode of the first switching thin film transistor 30. Then, a transparent conductive film is formed on the second passivation film 125 including the contact hole (not shown), and then the transparent conductive film is patterned by photolithography, thereby forming the pixel electrode 118 connected to the drain electrode of the first switching thin film transistor 30. The process is completed.

In the aforementioned drawings, the sensing driving circuit is positioned at the right side of the pixel region. However, it is possible to position the sensing driving circuit at the left side, upper side or lower side of the pixel region.

As mentioned above, the liquid crystal display device according to the present invention and the method of fabricating the same have the following advantages.

In the liquid crystal display device according to the present invention, the sensing driving circuit is provided with the reflective region. Thus, as compared with the related art liquid crystal panel including the sensing driving circuit provided only with the light-shielding region, the liquid crystal display panel of the present invention including the sensing driving circuit provided with the reflective region and the light-shielding region has the improved luminescence.

The liquid crystal display device according to the present disclosure includes the sensing driving circuit provided with the reflective region, to thereby reduce the power consumption due to the use of an external light or artificial light source.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A method of fabricating a liquid crystal display device with sensing function comprising:
   forming gate patterns including a gate line, a gate electrode of a first switching thin film transistor, a gate electrode of a second switching thin film transistor, a gate electrode of a sensing thin film transistor, and a storage capacitor lower electrode of a storage capacitor on a substrate;
   forming a gate insulation film on the substrate including the gate patterns;
   forming a semiconductor layer on the first switching thin film transistor, the second switching thin film transistor and the sensing thin film transistor formed on the substrate including the gate insulation film;
   forming source/drain electrode patterns including a data line crossing the gate line with the gate insulation film interposed therebetween, source and drain electrodes of the first switching thin film transistor, source and drain electrodes of the second switching thin film transistor, driving source and drain electrodes of the sensing thin film transistor, and a storage capacitor upper electrode of the storage capacitor;
   forming a first passivation film on the sensing storage capacitor and the second switching thin film transistor;
   forming a reflective electrode on the first passivation film and overlapping the regions of the storage capacitor and the second switching thin film transistor;

forming a second passivation film including a hole to expose the drain electrode of the first switching thin film transistor on the substrate including the reflective electrode; and forming a pixel electrode connected to the drain electrode of the first switching thin film transistor through the hole, wherein the first passivation film is removed on the sensing thin film transistor and the second passivation film contacts with the sensing thin film transistor.

2. The method of claim 1, wherein forming the gate patterns comprises forming a first driving voltage supplying line and a second driving voltage supplying line.

3. The method of claim 2, wherein the second driving voltage supplying line is formed as one body with the gate electrode of the sensing thin film transistor and the storage capacitor lower electrode.

4. The method of claim 1, wherein forming the source/drain electrode patterns comprises forming a read-out line connected to the drain electrode of the second switching thin film transistor and formed in parallel to the data line.

5. The method of claim 1, wherein the driving drain electrode of the sensing thin film transistor is formed as one body with the storage capacitor upper electrode of the first storage capacitor and the source electrode of the second switching thin film transistor.

6. The method of claim 1, wherein the sensing thin film transistor, the sensing storage capacitor and the second switching thin film transistor are formed into an in-line type and adjacent to the read-out line.

7. The method of claim 1, wherein the pixel electrode overlaps the sensing storage capacitor and wherein the first passivation film, the reflective electrode and the second passivation film are formed between the sensing storage capacitor and the pixel electrode.

8. The method of claim 1, wherein the first passivation film is thicker than the second passivation film.

* * * * *